United States Patent
Lee

(10) Patent No.: US 7,067,425 B2
(45) Date of Patent: Jun. 27, 2006

(54) METHOD OF MANUFACTURING FLASH MEMORY DEVICE

(75) Inventor: Keun Woo Lee, Yongin-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 159 days.

(21) Appl. No.: 10/736,720

(22) Filed: Dec. 16, 2003

(65) Prior Publication Data
US 2004/0266199 A1   Dec. 30, 2004

(30) Foreign Application Priority Data
Jun. 30, 2003   (JP)   .................. 10-2003-0043792

(51) Int. Cl.
*H01L 21/302*   (2006.01)

(52) U.S. Cl. ............... 438/689; 438/221; 438/296; 438/369; 438/370; 438/692; 438/719; 438/723; 438/724; 438/753; 438/756; 438/757; 438/770; 438/775

(58) Field of Classification Search ............ None
See application file for complete search history.

(56) References Cited

U.S. PATENT DOCUMENTS

| | | | |
|---|---|---|---|
| 6,177,333 B1 * | 1/2001 | Rhodes | 438/433 |
| 6,495,424 B1 * | 12/2002 | Kunikiyo | 438/296 |
| 6,635,532 B1 * | 10/2003 | Song et al. | 438/259 |
| 6,670,666 B1 * | 12/2003 | Shimizu | 257/298 |
| 2004/0178430 A1 * | 9/2004 | Rhodes et al. | 257/292 |

FOREIGN PATENT DOCUMENTS

KR   2003-0053312   6/2003

OTHER PUBLICATIONS

Wolf et al., Silicon Processing for the VLSI Era, 1986, Lattice Press, vol. 1, pp. 209-210,325.*
Official action in KR 2003-43792 dated Jun. 30, 2003.

* cited by examiner

*Primary Examiner*—Nadine G. Norton
*Assistant Examiner*—Eric B. Chen
(74) *Attorney, Agent, or Firm*—Marshall, Gerstein & Borun LLP

(57) ABSTRACT

A method of manufacturing a flash memory device includes the steps of forming a nitride film on an entire surface of a trench by means of an annealing process to prevent implanted ions for adjusting a threshold voltage from diffusing to a device isolation region, and forming a side wall oxide film on a surface of the nitride film. The nitride film plays a role of preventing ions implanted into a substrate for adjusting a threshold voltage from flowing into the side wall oxidation film.

4 Claims, 4 Drawing Sheets

METHOD OF MANUFACTURING FLASH MEMORY DEVICE

BACKGROUND

1. Field of the Invention

The invention relates to a method of manufacturing a semiconductor device and, more specifically, to a method of manufacturing a flash memory device.

2. Discussion of Related Art

In a general process of forming a device isolation film of a semiconductor device, a photoresist pattern for forming a device isolation film is formed on a predetermined region of a semiconductor substrate and a trench is formed by performing an etching process of micro-etching the photoresist pattern. At this time, an oxidation process of forming a side wall oxide film on the side wall of a trench is performed to compensate for etch damage generated from the etching process, make upper or lower edge of the trench rounded, and increase adhesive force of an insulating film to be buried in the inside of the trench. The oxidation process is performed at the temperature of about 1000° C.

At this time, when ion implantation for adjusting a threshold voltage is performed on the semiconductor substrate through an ion implantation process before a process of forming a device isolation film, the oxidation process makes the implanted ions for adjusting a threshold voltage diffuse into the side wall oxide film.

Accordingly, an active region has non-uniform distribution of ion density due to the diffusion of the implanted ions for adjusting a threshold voltage into the side wall oxide film and the non-uniform distribution of ion density deteriorates the performance of the device by generating humps, increasing a leakage current, and generating an inverse narrow width effect which lowers the threshold voltage.

SUMMARY OF THE INVENTION

The present invention is contrived to solve the above problems, and the present invention is directed to a method of manufacturing a flash memory device whose electrical characteristics are improved by suppressing generation of humps.

One aspect of the present invention is to provide a method of manufacturing a flash memory, comprising the steps of: performing an ion implantation process for adjusting a threshold voltage on a semiconductor substrate; forming a tunnel oxide film, a first polysilicon film and a pad oxide film on the semiconductor substrate, sequentially; etching the pad oxide film, the first polysilicon film, the tunnel oxide film and the semiconductor substrate to form a trench defining an active region and a device isolation region; forming a side wall oxide film on the side wall of the trench while suppressing diffusion of the implanted ion for adjusting the threshold voltage into the device isolation region to the maximum extent; performing an ion implantation process on the side wall of the trench and the active region adjacent to the device isolation region in order to compensate for ions for adjusting a threshold voltage which have diffused from the active region into the side wall oxide film; and forming a device isolation film by filling up inside the trench.

Another aspect of the present invention is to provide a method of manufacturing a flash memory, comprising the steps of: performing an ion implantation process for adjusting a threshold voltage on a semiconductor substrate; forming a tunnel oxide film, a first polysilicon film and a pad oxide film on the semiconductor substrate, sequentially; etching the pad oxide film, the first polysilicon film, the tunnel oxide film and the semiconductor substrate to form a trench defining an active region and a device isolation region; performing an annealing process for nitrifying a surface of the trench so as to form a nitride film for preventing the implanted ions for adjusting the threshold voltage from diffusing to the device isolation region; forming a side wall oxide film on the side wall of the trench while suppressing diffusion of the implanted ion for adjusting the threshold voltage to the device isolation region to the maximum extent; and forming a device isolation film by filling up inside the trench.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
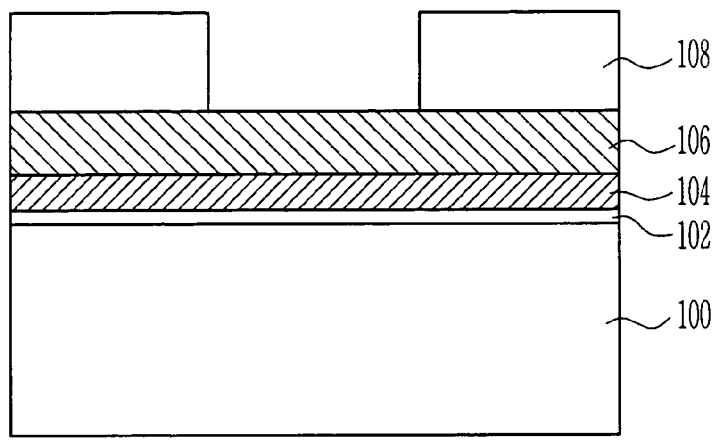
FIGS. 1 to 6 are views illustrating a method of manufacturing a flash memory device according to a preferred embodiment of the present invention.

The present invention will be described in detail by way of the following preferred embodiments with reference to the accompanying drawings. But, the following preferred embodiments can be modified into other embodiments within the scope of the present invention by those having ordinary skill in the art and access to the teachings of the present invention, and therefore the scope of the present invention is not limited to the following embodiments. In the following explanation, a description that one layer exists on another layer means that one layer may exist on the very another layer or other layer may lie between one layer and another layer. Thickness and size of each layer in the figures are blown up for the purpose of convenience and clearness of explanation. Like reference numerals in the figures are used to identify the same or similar parts.

First Embodiment

FIGS. 1 to 6 are views illustrating a method of manufacturing a flash memory device according to a preferred embodiment of the present invention.

Referring to FIG. 1, a screen oxide film (not shown) is formed on a semiconductor substrate 100. The semiconductor substrate 100 is divided into a region where n-channel transistor is formed (hereafter "PMOS region") and a region where p-channel transistor is formed (hereafter "NMOS region"). The screen oxide film serves as a buffer layer for relieving damage of the semiconductor substrate 100 in an ion implantation process to be performed later. The screen oxide film may be formed in thickness of 50 to 70 Å by means of a dry or wet oxidation method at a temperature of 700 to 900° C.

Next, an ion implantation process is performed on the semiconductor substrate 100 for forming a well area and adjusting a threshold voltage. Arsenic (As) or phosphorus (P) is used as ion implantation dopant for adjusting a threshold voltage of PMOS area, and boron (B) is used as ion implantation dopant for adjusting a threshold voltage of NMOS area. Then, the screen oxide film is eliminated through the etching process.

Next, a gate oxide film 102, a first polysilicon film 104 and a pad nitride film 106 are formed sequentially on the semiconductor substrate 100.

The gate oxide film 102 may be formed by performing a dry or wet oxidation process at a temperature of 750 to 850° C. and then performing an annealing process for 20 to 30 minutes using $N_2$ gas at a temperature of 900 to 910° C. It is preferred that the gate oxide film 102 is formed in thickness of about 50 to 100 Å.

The first polysilicon film 104 may be formed at the temperature of about 500 to 550° C. and at the pressure of about 0.1 to 3 Torr using Si source gas such as $SiH_4$ or $Si_2H_6$ and $PH_3$ gas. It is preferred that the first polysilicon film 102 is formed in a thickness of about 250 to 500 Å.

The pad nitride film 106 may be formed of a silicon nitride film of $Si_3N_5$ in thickness of about 900 to 2000 Å by a low pressure-chemical vapor deposition (hereafter, "LP-CVD").

Figure 2:
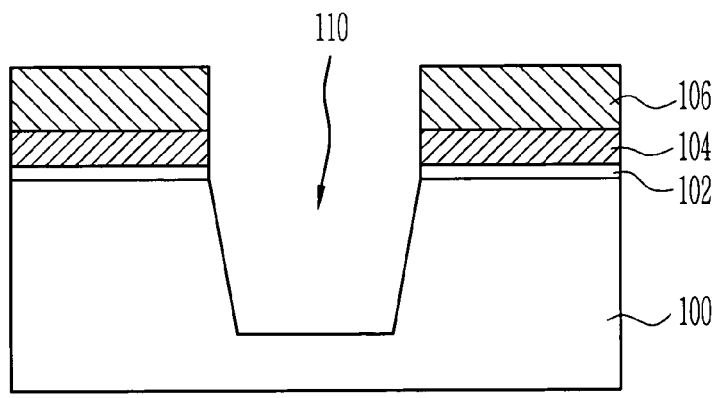

Referring to FIG. 2, a photoresist pattern 108 defining a trench 110 is formed on the pad nitride film 106 and the trench 110 defining an active region and an inactive region is formed by performing an etching process of etching the photoresist 108 using etching mask.

It is preferred that the trench 110 has a tilt angle of 75 to 85° to the semiconductor substrate 100.

Next, a side wall oxide film 112 is formed on the side wall and the bottom of the trench 110 through the oxidation process. The side wall oxide film 112 is formed for compensating for etch damage generated during the etching process of forming the trench 110, making upper or lower edge of the trench 110 rounded, and increasing adhesive force of an insulating film to be buried in the inside of the trench 110. The side wall oxide film 112 may be formed at a temperature of about 800 to 950° C. by a dry oxidation method, and it is preferred that the side wall oxide film 112 may be formed in thickness of 50 to 100 Å.

In the conventional method where an oxidation process for forming the side wall oxide film 112 has been performed at the high temperature of about 1000 to 1150° C., boron ions implanted on the active area for adjusting a threshold voltage are diffused into the side wall oxide film 112 and therefore ion density for adjusting the threshold voltage in the active area adjacent to the trench 110 is lowered. But, in the present invention, it is possible to decrease diffusion of the boron ions implanted on the active area for adjusting a threshold voltage into the side wall oxide film 112 by performing the oxidation process at the temperature of 800 to 950° C.

Figure 3:
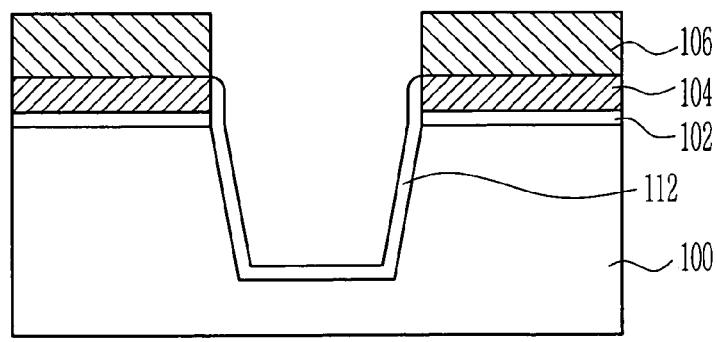

Referring FIG. 3, an ion implantation process 114 is performed to compensate for boron ions diffused from the active region adjacent to the trench 110 and the side wall of the trench 110 into the side wall oxide film 112 through the oxidation process. The amount of the diffused boron ions is reduced due to the lowered temperature of the oxidation process, but it is not possible to absolutely prevent the diffusion of the boron ions. Therefore, the ion implantation process 114 is performed on the active region adjacent to the trench 110 and the side wall of the trench 110 to supplement the density of the boron ions. The ion implantation process 114 is performed at the doping level of about 3E11 to 1E 11 ions/cm² at the energy of 10 to 30Kev. At this time, the tilt of the ion implantation process is adjusted according to the tilt of the trench 110 and it is preferred that the tilt of the ion implantation process is about 0° to 30°. The trench has a tilt angle of about 75° to 85°. Therefore, when the ion implantation is performed at the angle of about 0° to 30°, it is possible to supply the active region adjacent to the trench 110 with enough ions. As mentioned above, by performing ion implantation of boron ions on the active region adjacent to the trench 110 at the low doping level, the hump is remedied, the leakage current is also decreased so as to improve the electrical characteristics of a transistor, and the standby current is decreased.

Figure 4:
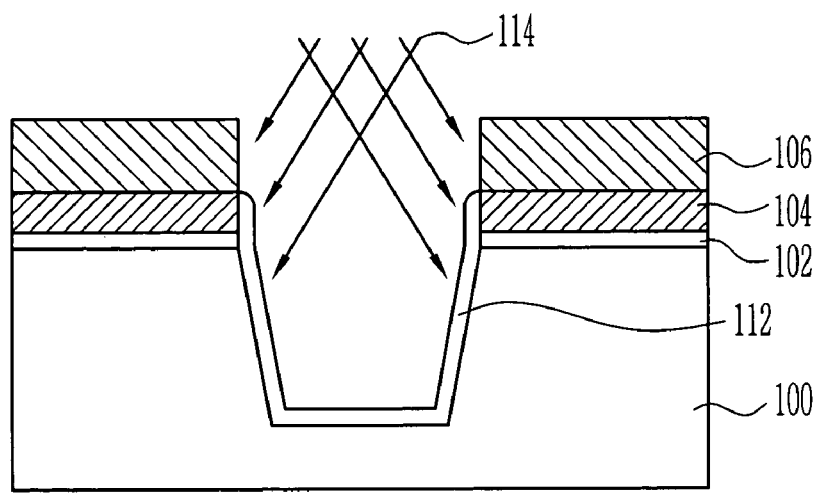

Referring to FIG. 4, a deposition process is performed so that the inside of the trench 110 is filled with a high-density plasma (HDP) oxide film having good gap fill property, and then a device isolation film 116 is formed by performing a smoothing process such as a chemical mechanical polishing (CMP) process until the pad nitride film 106 is exposed. Then, the pad nitride film 106 is eliminated through a wet etching process.

Next, a second polysilicon film 118 to be used as a floating gate is deposited. The second polysilicon film 118 may be formed by means of a low pressure-chemical vapor deposition (LP-CVD) method using $SiH_4$ or $Si_2H_6$ gas and $PH_3$ gas. For example, the second polysilicon film 118 is formed in the thickness of 800 to 3000 Å at a temperature of 500 to 550° C. and at a pressure of 0.1 to 3.0 Torr.

Figure 5:
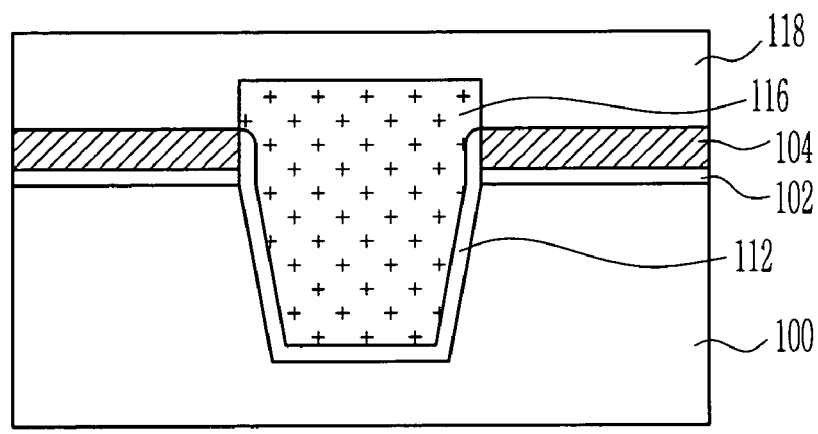
Figure 6:
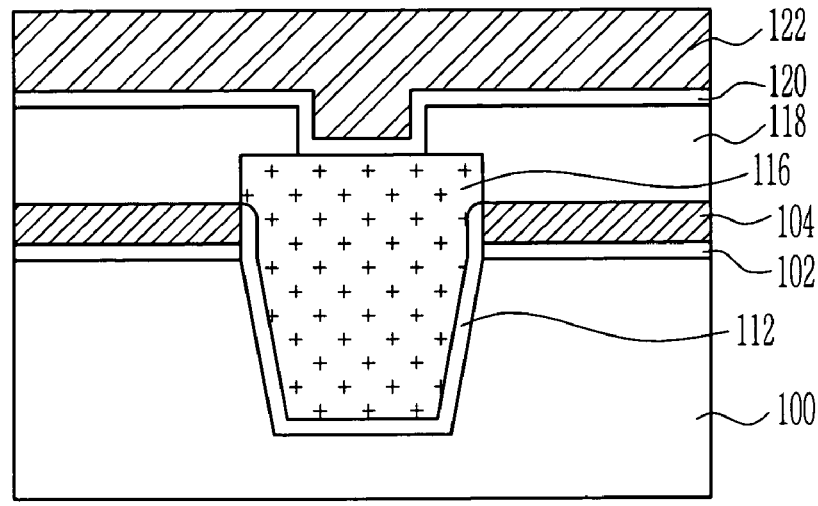

Referring to FIG. 5, the second polysilicon film 118 is patterned. It is preferred that the second polysilicon film 118 is patterned so that the second polysilicon film 118 overlaps with the device isolation film 116 in a predetermined thickness.

Next, a gate electrode is formed by forming a dielectric film 120 and a control gate 122 on the semiconductor substrate 100 having the second polysilicon film 118 thereon.

Second Embodiment

Figure 7:
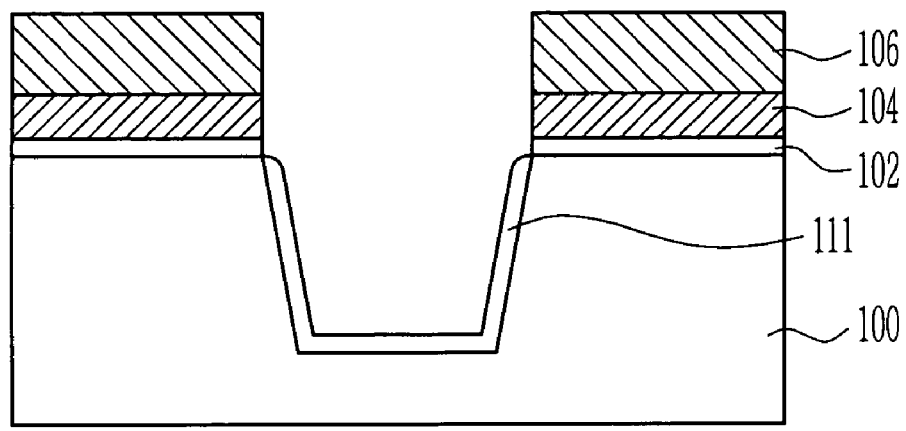
FIGS. 7 to 8 are views illustrating a method of manufacturing a flash memory device according to another preferred embodiment of the present invention.
Figure 8:
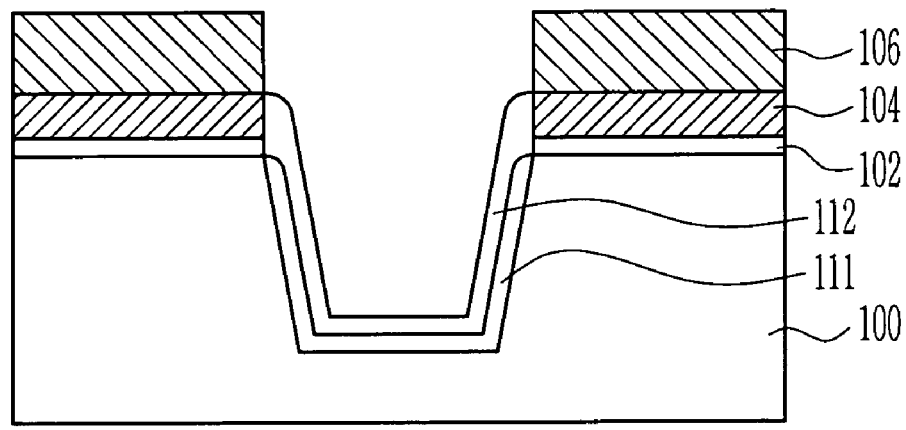

FIGS. 7 to 8 are views illustrating a method of manufacturing a flash memory device according to a second preferred embodiment of the present invention.

The processes until the trench 110 is formed are same as the processes of the first embodiment, and therefore are omitted in this embodiment.

Referring to FIG. 7, an annealing process is performed under $N_2O$ atmosphere on the structure where the trench has been formed. It is preferred that the annealing process is performed at the temperature of 800 to 900° C. The surface of the trench 110, that is, the surface of the silicon substrate 100 exposed by the trench 110 through the annealing process is nitrified, and then the nitride film 111 is formed in the thickness of 10 to 20 Å. The nitride film 111 plays a role of preventing implanted ions for adjusting a threshold voltage from flowing into the side wall oxide film (see 111 of FIG. 8). This is the reason because a bonding energy of Si—N which is about 4.5 eV is larger than that of Si—H which is about 3.17 eV.

Referring to FIG. 8, the side wall oxide film 112 is formed on the side wall and the bottom of the trench 110 through an oxidation process. The side wall oxide film 112 is formed for compensating for etch damage generated during the etching process of forming the trench 110, making upper or lower edge of the trench 110 rounded, and increasing adhesive force of an insulating film to be buried in the inside of the trench 110. The side wall oxide film 112 may be formed at a temperature of about 800 to 950° C. by a dry oxidation method, and it is preferred that the side wall oxide film 112 is formed in thickness of 50 to 100 Å. In the conventional method where an oxidation process for forming the side wall oxide film has been performed at a high temperature of about 1000 to 1150° C., boron ions implanted into the active area for adjusting a threshold voltage are diffused into the side wall oxide film 112 to make ion density for adjusting the threshold voltage in the active area adjacent to the trench 110 lowered. But, in the present invention, it is possible to decrease diffusion of the boron ions implanted into the active area for adjusting a threshold voltage into the side wall oxide film 112 by performing the oxidation process at a temperature of 800 to 950° C.

Next, a deposition process is performed so that the inside of the trench 110 is filled with a high-density plasma (HDP) oxide film having good gap fill property, and then the device isolation film 116 is formed by performing a smoothing process such as a chemical mechanical polishing (CMP) process until the pad nitride film 106 is exposed. Then, the pad nitride film 106 is eliminated through a wet etching process.

The processes of this time are the same as those of the first embodiment.

Figure 9:
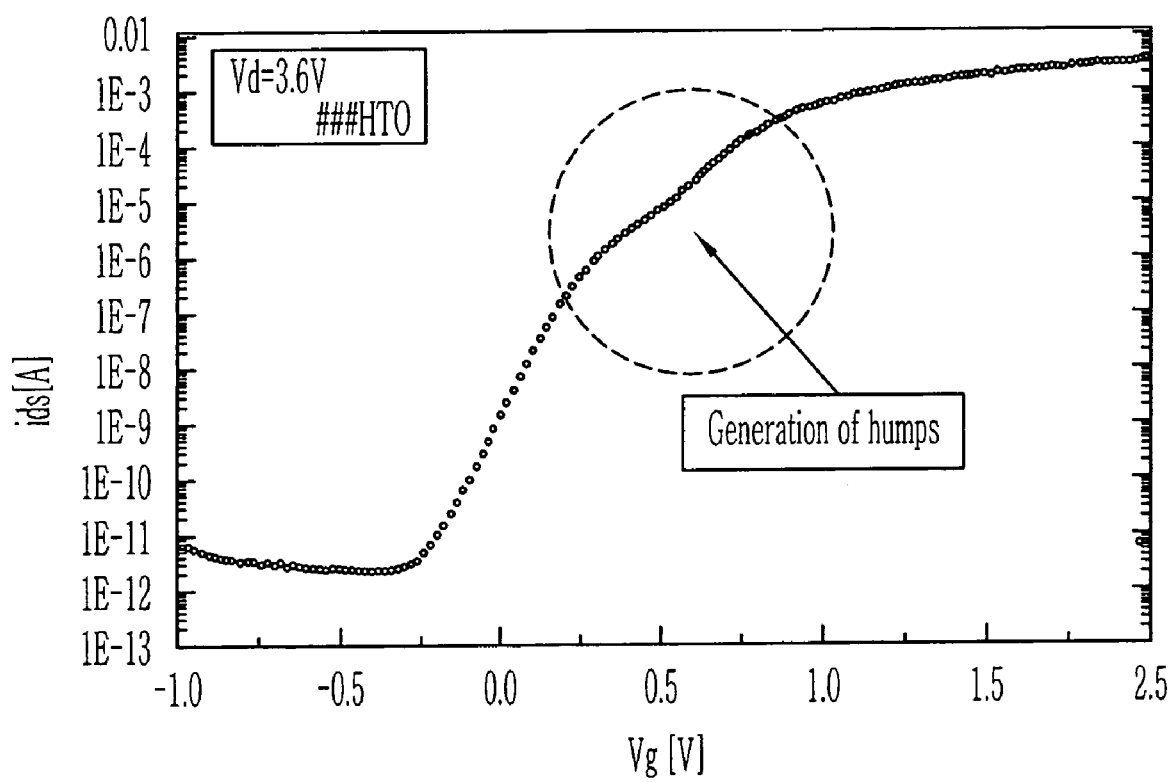
FIG. 9 is a graph illustrating generation of humps on a low-voltage NMOS transistor.

FIG. 9 is a graph illustrating that humps are generated on the low-voltage NMOS transistor. In the conventional method, as shown in the graph of FIG. 9 showing the relation of a gate voltage (Vg) to a drain current (Ids), generation of humps makes an inverse narrow width effect which increases a leakage current and decreases a threshold voltage generated, as a result, to deteriorate the electrical characteristics of a device. But, in the present invention, it is possible to suppress generation of humps and therefore the electrical characteristics of a device are improved. According to the preferred embodiment of the present invention, the performance of the device is improved by making the ion density of the active region on which ions for adjusting a threshold voltage uniform through an oxidation process for forming a side wall oxide film of the trench 110 performed at a lower temperature of that of the conventional method, and an ion implantation process for compensating for ions diffused into the side wall oxide film during the oxidation process.

According to the present invention, by lowering the temperature at which the oxidation process of forming the side wall oxide film in the trench is performed, and performing the ion implantation process of compensating for ions diffused into the side wall oxide film during the oxidation process, the ion density of the active region into which ions for adjusting a threshold voltage are implanted can be made to be uniform, so that it is possible to improve performance of a device.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of manufacturing a flash memory, comprising the steps of:
    performing an ion implantation process for adjusting a threshold voltage on a semiconductor substrate;
    sequentially forming a tunnel oxide film, a first polysilicon film and a pad nitride film on the semiconductor substrate;
    etching the pad oxide film, the first polysilicon film, the tunnel oxide film and the semiconductor substrate to form a trench defining an active region and a device isolation region;
    forming a nitride film on an entire surface of the trench by means of an annealing process to prevent the implanted ions for adjusting the threshold voltage from diffusing to the device isolation region;
    forming a side wall oxide film on a surface of the nitride film and a sidewall of the polysilicon film; and
    forming a device isolation film by filling up inside the trench.

2. A method of claim 1, wherein the side wall oxide film is formed by a dry oxidation method at a temperature in the range of 800 to 950 ° C.

3. A method of claim 1, wherein the annealing process is performed under $N_2O$ atmosphere at a temperature in the range of 800 to 900 ° C.

4. A method of claim 1, after the step of forming a device isolation film, further comprising the steps of:
    eliminating the pad nitride film;
    forming a second polysilicon film for a floating gate on the structure where the pad nitride film is eliminated;
    forming a dielectric film on the structure where the second polysilicon film is formed; and
    forming a third polysilicon film for a control gate on the dielectric film.

* * * * *